United States Patent [19]
Howell

[11] 3,986,152
[45] Oct. 12, 1976

[54] NEGATIVE IMPEDANCE NETWORK

[75] Inventor: Edward K. Howell, Simsbury, Conn.

[73] Assignee: General Electric Company, New York, N.Y.

[22] Filed: June 16, 1975

[21] Appl. No.: 586,863

[52] U.S. Cl. .............................. 333/80 T; 307/324; 323/4; 330/22; 331/115
[51] Int. Cl.² ................................................H03H 5/12;
[58] Field of Search................333/80 T; 30/22, 40, 61; 331/115; 307/297, 322, 324; 323/1,4

[56] References Cited

UNITED STATES PATENTS

| | | | |
|---|---|---|---|
| 3,693,105 | 9/1972 | Kleinberg | 333/80 T X |
| 3,878,471 | 4/1975 | Ahmed | 307/297 X |

*Primary Examiner*—Paul L. Gensler
*Attorney, Agent, or Firm*—Robert A. Cahill; Walter C. Bernkopf; Frank L. Neuhauser

[57] ABSTRACT

A negative impedance network includes a pair of network terminals, with one terminal connected to the base of an emitter-follower transistor. A current mirror includes one current path connected to supply a first current to a fixed impedance means through the collector-emitter circuit of the transistor and a second current path supplying a second current to the one network terminal in fixed ratio to the first current, such that an effective negative impedance is presented in parallel to an external circuit connected across the network terminals.

4 Claims, 3 Drawing Figures

NEGATIVE IMPEDANCE NETWORK

BACKGROUND OF THE INVENTION

The present invention relates to negative impedance networks which have numerous application in the electronics art. Oscillators rely on the establishment of an effective negative resistance in conjunction with a resonant or tank circuit in order to achieve sustained oscillation. Negative resistance is also utilized in regenerative or super-regenerative amplifier design to achieve high gain. So-called Q-multipliers utilize negative resistance to adjust the Q of resonant circuits in narrow bandwidth filter designs. Other applications of negative impedance or resistance networks will readily occur to those skilled in the electronics art.

The typical design approach to establishing a negative impedance characteristic is to provide a two terminal network including an electronic voltage amplifier with positive or regenerative feedback fashioned such that the impedance, typically resistive impedance, presented across the network terminals has a negative characteristic. The use of voltage amplifiers renders this approach to establishing a negative impedance relatively complex in design and thus rather expensive to implement.

It is accordingly an object of the present invention to provide an improved negative impedance network.

An additional object of the present invention is to provide a negative impedance network of the above character which is highly stable in operation and insensitive to the dynamic characteristics of the active components incorporated therein.

A further object is to provide a negative resistance network of the above character which is highly suitable for monolithic integrated circuit implementation and thus is highly reproducible.

Still another object of the present invention is to provide a negative impedance network of the above character which is simple in construction and inexpensive to manufacture.

Other objects of the invention will in part be obvious and in part appear hereinafter.

SUMMARY OF THE INVENTION

In accordance with the present invention, there is provided a negative impedance network having a pair of network terminals across which is established an effective negative impedance. One network terminal is connected to the base of an emitter-follower transistor. A first current source supplies a first current through the collector-emitter circuit of the transistor and an impedance means, such as a resistor, to a voltage source which is also connected to the other network terminal. A second current source supplies a second current to the one network terminal. The two current sources are interconnected, such as in current mirror fashion, to maintain the magnitude of the second current in a fixed ratio to the first current. A voltage appearing across the network terminals establishes a current magnitude for the first current in accordance with the impedance of the impedance means. This produces a proportionate magnitude of the second current which flows out from the one network terminal. Since the magnitude of the first current for a given network terminal voltage is determined by the impedance of the impedance means, so too is the level of the second current determined by the impedance means. Thus, the impedance exhibited across the network terminals is determined by the impedance of the impedance means. The second current produced in response to the terminal voltage flows out from the network, not into the network, and thus the impedance exhibited across the network terminals has a negative characteristic.

The invention accordingly comprises the features of construction, combinations of elements, and arrangements of parts which will be exemplified in the constructions hereinafter set forth, and the scope of the invention will be indicated in the claims.

For a fuller understanding of the nature and objects of the invention, reference should be had to the following detailed description taken in conjunction with the accompanying drawing; in which.

DETAILED DESCRIPTION

The negative impedance network of the present invention in its various embodiments is also disclosed in applicant's copending application, Ser. No. 586,864, entitled "Ground Fault Circuit Interrupter Utilizing a Single Transformer" and filed concurrently herewith. As disclosed in this copending application, the disclosure of which is specifically incorporated herein by reference, the negative resistance network of the present invention is utilized as a resistance threshold detector capable of developing a readily sensible signal output indication when the neutral conductor of an electrical power distribution circuit is faulted to ground through a resistance of, for example, 4 ohms or less. Under these circumstances, the GFCI device is required to interrupt the circuit since such a neutral ground fault has a desensitizing effect on the ability of the GFCI device to sense the true level of hazardous ground leakage current flowing through a fault on the line conductor. As taught in the above-noted copending application, the use of a negative resistance network in a GFCI device facilitats the elimination of the second, so-called "neutral" excitation transformer normally utilized in GFCI devices. That is, the subject negative resistance network is capable of operating in conjunction with the ground leakage current detector, specifically a differential current transformer in detecting desensitizing neutral ground faults. As will be brought out below, the subject negative resistance network or, more broadly, negative impedance network has a variety of other applications in addition to its application to GFCI devices.

Figure 1:
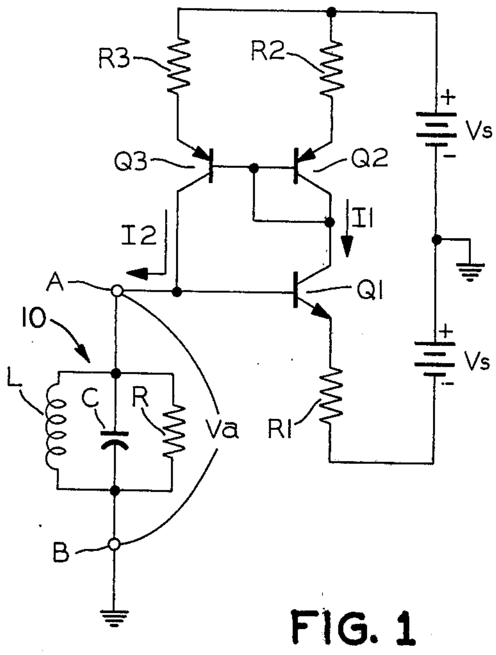
FIG. 1 is a detailed circuit schematic diagram of a negative impedance network constructed in accordance with one embodiment of the present invention.

Turning now to the drawing, the negative resistance network of the present invention is illustrated in its most basic form in FIG. 1. As seen, the negative resistance network is a two terminal network consisting of a terminal A and a terminal B, the latter being connected to a suitable source of reference potential, such as ground. Terminal A is connected to the base of an emitter-follower transistor Q1. The emitter of transistor Q1 is connected through a resistor R1 to a negative supply voltage $-Vs$, while the collector of transistor Q1 is connected through the collector-emitter circuit of a transistor Q2 and a resistor R2 to a positive supply voltage +Vs. The mid-point between these positive and negative supply voltages is ground. Terminal A is also connected through the collector-emitter circuit of a transistor Q3 and a resistor R3 to the positive supply voltage +Vs. The bases of transistors Q2 and Q3 are connected together with a common connection to the collector of transistor Q2. It will be recognized that transistors Q2 and Q3 are interconnected to function as a current mirror. Consequently, the collector current I2 of transistor Q3 is maintained at a fixed ratio relative to the collector current I1 of transistor Q2. If transistor Q2 and Q3 are identical and resistors R2 and R3 equal, the collector currents I1 and I2 will at all times be essentially equal.

The operation of the negative resistance network of FIG. 1 is basically as follows. Ignoring the base-emitter voltage of transistor Q1, the voltage across resistor R1 ($I1 \times R1$) is equal to the supply voltage Vs plus the voltage Va across the network terminals A, B. Assuming for purposes of the present description that the currents I1 and I2 are equal, it is seen that both of these currents consist of a constant component determined by the ratio Vs/R1 and a variable component determined by the ratio Va/R1. It will be noted that with the terminal voltage Va equal to zero, the variable current component is also equal to zero. However, the current I2 still contains the constant or DC component Vs/R1 which flows away from the negative resistance network through terminal A. As the voltage Va rises positively, the voltage at the emitter of transistor Q1 is raised proportionately, thus increasing the current I1. The current mirror insures that the current I2 increases proportionately, and thus increased current flows from the negative resistance network through terminal A. It is the fact that the current I2 flows from the network through terminal A in response to the application of a voltage across the network terminals which makes the network a negative resistance network. The negative impedance developed by the network is exhibited across the network terminals A, B, and the value of this negative impedance is determined by the resistance of resistor R1. It will be appreciated that the network of the present invention is not limited to a negative, purely resistive impedance network, since the emitter load of transistor Q1 can be designed to establish a negative impedance across the network terminals having a reactive component as well.

As was disclosed in my above-noted copending application, a resonant or tank circuit, indicated at 10 in FIG. 1 herein, was periodically connected across the network terminals A, B for a sampling period of prescribed length pursuant to detecting the presence of a desensitizing neutral ground fault. This tank circuit 10 consisted of an inductance L largely constituted by the inductance of the differential transformer secondary winding, a capacitance C largely determined by a capacitor connected across the secondary winding, and a resistance R largely determined by the resistance of a neutral ground fault reflected into the tank circuit via the differential current transformer. Upon connection of the tank circuit 10 across the network terminals, the DC component of the current 12 flowing from the network through terminal A shock excited the tank circuit, initiating a ring oscillation therein. This raised the voltage Va at terminal A, causing a corresponding increase in the voltage at the emitter of transistor Q1. Current I1 increases, as does current I2. Consequently, additional current (AC component) is pumped into the tank circuit 10. If the resistance R is equal to the effective negative resistance established by resistor R1, these two resistances cancel, leaving a pure LC resonant circuit of infinite Q which will sustain the ringing oscillation without loss throughout the sampling period. If the resistance R is greater than the resistance of resistor R1, the voltage Va progressively increases, as do the currents I1 and I2. In this situation the tank circuit 10 has a negative Q and the ringing oscillation therein builds up in amplitude to regenerative fashion over the sampling period. On the other hand, if the resistance R is less than the resistance of resistor R2, the current I2 cannot make up for losses in the tank imposed by the resistance R and the ringing oscillation is damped (degenerative) such that its amplitude decreases over the sampling period. In this situation, the tank circuit has a positive Q.

It is thus seen that for a given resistance of resistor R1, the criteria for sustained oscillation of tank circuit 10 is its resistance R. As disclosed in my copending application, by monitoring the amplitude of the ringing oscillation over the sampling period, the negative resistance network of FIG. 1 functions as a resistance threshold detector of the resistance R in the tank circuit. By proper selection of the resistance of resistor R1, the effective inductance L and capacitance C of the tank circuit, and the turns ratio of the differential transformer in the GFCI device, the negative resistance network of FIG. 1 can be utilized to detect resistance values over a very large range, with electrical isolation between the detector circuit and the variable resistance. The sensitivity of the detector to changes in resistance R improves as the ratio of the resistance of resistor R1 to the characteristic impedance of the tank circuit (square root of L/C) is reduced. Sensitivity is further enhanced by establishing the resistance threshold level at a point where the rate of change of Q for small variations of resistance within the vicinity of the resistance threshold level is relatively high.

It will be noted that with a resonant circuit connected across the network terminals, A, B, and the resistance R of the tank circuit equal to the resistance of resistor R1, an oscillator capable of sustained oscillation is achieved. On the other hand, if the resistance R of the tank circuit is greater than the resistance of resistor R1, such that the circuit functions in a regenerative mode, i.e., the oscillation amplitude increases with time, the circuit can function as an amplifier. This is seen from the fact that the initial amplitude of the oscillation in the tank circuit is a function of the AC or signal voltage Va applied across the network terminals A, B. The amplitude of the oscillation N cycles later is the function of the initial signal voltage Va and the negative Q of the tank circuit established by the relationship of the resistance R and the resistor R1. This relationship is thus in reality voltage gain.

As described above, the negative resistance network has application as a resistance threshold detector for sensing the neutral fault resistance in a GFCI application. In this application, the resistance to be detected is included in a resonant tank circuit. It will be appreciated that the resistance R to be detected need not be included in a tank circuit, but can simply be connected across the network terminals A, B. In this application, the resistance of resistor R1 is established such that it is largeer than the resistance R within the desired detection range, such that the net resistance appearing across the network terminals is positive.

Since the negative resistance of the network exhibited across terminals A, B, is in parallel with any resistance R physically connected across the network terminals, the net resistance is determined by the solution of the equation $(R \times (-R1))/(R+(-R1))$. If $R$ equals $R1$, the net resistance across the network terminals A, B is infinite, and the voltage V*a* sits at a maximum level slightly below the positive supply voltage +V*s*. Thus resistance R exceeding resistor R1 produce an essentially constant voltage V*a*. However, for resistances R less than the value of resistance R1, the net resistance across the network terminals is positive and the voltage V*a* will vary accordingly. It can be shown that for small variations of resistance R within a resistance range slightly less than the value of resistor R1, there is a very dramatic change in the net positive resistance appearing across the network terminals. These dramatic changes in net positive resistance produce a correspondingly dramatic change in the voltage V*a*. It is thus seen that monitoring the voltage V*a* to detect variations of the resistance R in the range where R is approximately equal to but less than R1 affords a resistance detector of extremely high sensitivity and resolution. Obviously, the resistor R1 may be implemented as a variable resistor such as to accommodate convenient adjustment of the negative resistance exhibited across the network terminals.

It will also occur to those skilled in the art that the negative resistance network of the present invention may also be advantageously utilized in a bandpass filter to provide a higher Q than would otherwise be possible.

Figure 2:
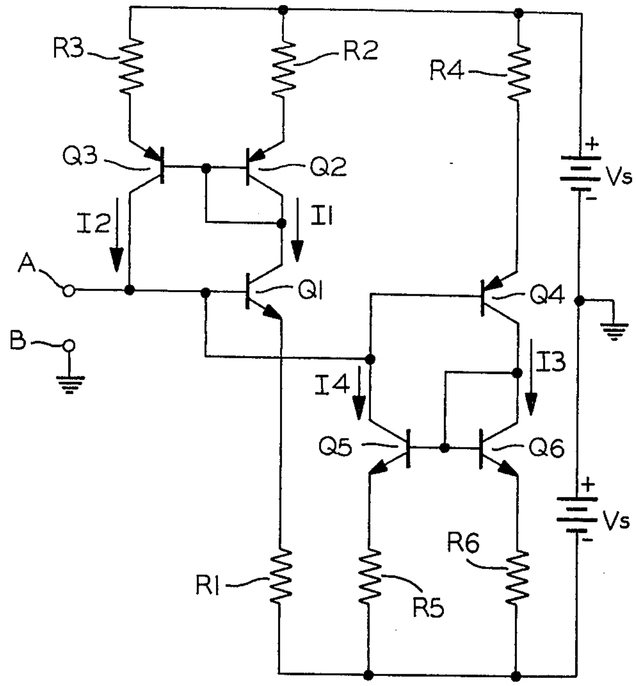
FIG. 2 is a detailed circuit schematic diagram of a negative resistance network constructed in accordance with an alternative embodiment of the invention.

The negative resistance network of FIG. 2 is a derivative of the network of FIG. 1, and is useful in those applications where it is desired to eliminate the DC component of the current I2 flowing from network terminal A. This is achieved by providing complementary current sources for the sources of currents I1 and I2 in FIG. 1. Thus as seen in FIG. 2, network terminal A is connected to the base of emitter-follower transistor Q1 and receives the current I2 through one side of the current mirror constituted by transistors Q2, Q3 and resistors R2, R3. The other current source of this current mirror supplies current I1 through the collector-emitter circuit of transistor Q1 and resistor R1 to the negative supply voltage −V*s*.

Network terminal A is also connected to the base of an emitter-follower transistor Q4 and through the collector-emitter circuit of a transistor Q5 and resistor R5 to the negative supply voltage −V*s*. The emitter of transistor Q4 is connected to the positive supply voltage +V*s* through a resistor R4, while its collector is connected through the collector-emitter circuit of a transistor Q6 and a resistor R6 to the negative supply voltage −V*s*. Transistors Q5 and Q6 are interconnected at a current mirror complementing the current mirror of transistors Q2 and Q3. The current sources for this complementary current mirror are the collector current I3 of transistor Q6 and the collector current I4 of transistor Q5.

With zero voltage V*a* at terminal A and resistors R1 and R4 equal, the current I2 flowing toward terminal A equals the current I4 flowing away from terminal A, and thus there is no current available for flow through a circuit connected across the network terminal A and grounded terminal B. As the voltage V*a* at terminal A rises positively, the currents I1 and I2 increase by the ratio V*a*/R1. It is thus seen that the resistance of resistor R1 again determines the effective negative resistance presented across the network terminals A, B. However, as the voltage V*a* increases positively to increase the currents I1 and I2, there is an opposite effect on the magnitudes of the currents I3 and I4. This is due to the fact that the voltage V*a* presented at the base of transistor Q4 reduces the current I3 by the same amount that the current I2 is increased. By virtue of the complementary current mirror (transistors Q5 and Q6), the current I4 is reduced in magnitude by the same amount that the current I2 is increased. There is thus created a push-pull effect, in that the current flowing from terminal A available to an external circuit connected across the network terminals is equal to twice the voltage V*a* divided by the value of resistor R1. Consequently, the negative resistance exhibited at the network terminals by the circuit of FIG. 2 is one-half the resistance of resistor R1.

Figure 3:
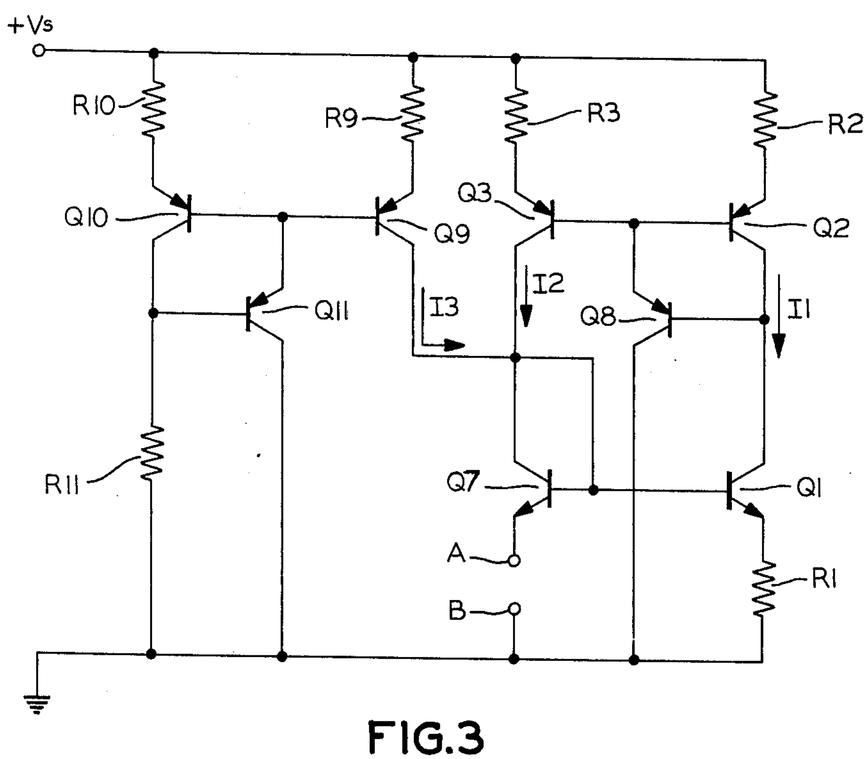
FIG. 3 is a detailed circuit schematic diagram of still another embodiment of a negative resistance network constructed in accordance with the present invention.

The negative resistance network of FIG. 3 differs from the network of FIG. 1 principally through the inclusion of an additional current source capable of supplying a DC or constant current to the network terminal A at a level essentially independent of the negative resistance determining resistor R1. As seen in FIG. 3, terminal A is connected through the base emitter junction of a transistor Q7 to the base of emitter-folloer transistor Q1. Terminal A is also connected via transistor Q7, which is connected as a diode, to receive the current I2 flowing from one side of the current mirror consisting of transistors Q2 and Q3. As a slight departure from the current mirrors of FIGS. 1 and 2, the collector and base of transistor Q2 are connected together through the base emitter junction of a transistor Q8. The collector of this transistor is grounded. The operation of this current mirror in FIG. 3 is identical in that the current I2 is maintained in fixed ratio to the current I1. Thus, if the transistors Q2 and Q3 are identical and resistor R3 equal to resistor R2, the currents I1 and I2 are maintained equal.

Also supplied to terminal A through diode connected transistor Q7 is a current I3 derived through transistor Q9 and resistor R9 connected with transistor Q10 and resistor R10 as a current mirror. The base and collector of transistor Q10 are connected through the base-emitter junction of a transistor Q11 whose collector is grounded. The magnitude of the current I3 is determined by the value of a resistor R11 connected between the collector of transistor Q10 and ground. Thus, the level of current I3 can be established quite independently of the resistance of resistor R1.

Another attribute of the negative resistance network of FIG. 3 is that, by virtue of the diode-connected transistor Q7, a single-ended power supply can be utilized. It is seen that transistor Q7 merely serves to offset the voltage applied to the base of transistor Q1 from the voltage V*a* at terminal A by the base-emitter voltage drop of transistor Q7. In this context, a diode of diode-connected transistor, or a zener diode, may be incorporated in the negative resistance network of FIG. 1 so as to eliminate the need for a double-ended power supply. Returning to FIG. 3, when the voltage V*a*at terminal A is zero, the current I3 produces a voltage drop across transistor Q7, causing a small current flow I1 through resistor R1 and, by virtue of the current mirror (transistor Q2 and Q3), an equal current I2 flowing through transistor Q7 to terminal A. When the voltage at terminal A rises, current I1 increases as does current I2. The increased current I2 flows through transistor Q7 to terminal A. With small signal voltages at terminal A, the voltage gain of transistor Q1 is less than unity, and thus changes in signal voltages do not produce corresponding changes in current I1. Consequently, the negative resistance appearing across terminals A, B is larger in magnitude than the resistance of resistor R1. As the current I3 is reduced to a level comparable with or less than the current I2, the voltage gain improves, approaching unity, and the negative resistance across terminals A, B, decrease toward the resistance value of resistor R1.

It will thus be seen that the object set forth above, among those made apparent in the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described my invention, what I claim as new and desire to secure by Letters Patent is:

1. A negative impedance network comprising, in combination:

A. a pair of input/output terminals;

B. a first transistor having a collector-emitter circuit and a base directly, DC connected to a first one of said terminals;

C. a current mirror connected to a supply bus and including second and third transistors,
  1. said second transistor having a collector directly connected to said first transistor such that the collector current of said second transistor constitutes the current flowing through the collector-emitter circuit of said first transistor, and
  2. said third transistor having a collector connected to supply its collector current to said first terminal,
  3. the levels of collector currents of said second and third transistors being maintained in fixed ratio;

D. a voltage source connected to the second one of said terminals; and

E. impedance means connecting said collector-emitter circuit of said first transistor to said voltage source;

F. the impedance exhibited across said input/output terminals being a negative quantity determined by the impedance of said impedance means.

2. The negative impedance network defined in claim 1, which further includes:

A. a fourth transistor having a collector-emitter circuit and a base directly, DC connected to said first terminal;

B. an additional current mirror connected to said voltage source and including fifth and sixth transistors;
  1. said fifth transistor having a collector connected to said fourth transistor such that the collector current of said fifth transistor flows through the collector-emitter circuit to said fourth transistor, and
  2. said sixth transistor having a collector connected to said first terminal to receive its collector current therefrom,
  3. the levels of collector currents of said fifth and sixth transistors being maintained in fixed ratio.

3. Negative impedance network defined in claim 1, which further includes an essentially constant current source connected to supply a fixed current to said first terminal supplementing the collector current of said third transistor.

4. The negative impedance network defined in claim 3, which further includes diode means connected between said base of said first transistor and said first terminal, said diode means conducting said collector current of said third transistor and said fixed current to said first terminal.

* * * * *